United States Patent
Blednov

(10) Patent No.: US 9,659,847 B2
(45) Date of Patent: May 23, 2017

(54) TERMINAL STRUCTURE FOR ACTIVE POWER DEVICE

(71) Applicant: NXP USA, INC., Austin, TX (US)

(72) Inventor: Igor Ivanovich Blednov, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/046,652

(22) Filed: Feb. 18, 2016

(65) Prior Publication Data

US 2017/0084524 A1     Mar. 23, 2017

(30) Foreign Application Priority Data

Sep. 18, 2015    (WO) .................. PCT/IB2015/001967

(51) Int. Cl.
*H01L 23/48*    (2006.01)
*H01L 23/498*   (2006.01)
(Continued)

(52) U.S. Cl.
CPC ...... *H01L 23/49811* (2013.01); *H01L 21/486* (2013.01); *H01L 23/49827* (2013.01); *H01L 23/49844* (2013.01); *H01L 29/7816* (2013.01)

(58) Field of Classification Search
CPC . H01L 2624/00014; H01L 2224/48091; H01L 2224/48137; H01L 2224/49175; H01L 2924/3011; H01L 2924/30111; H01L 2924/3025; H01L 2224/05599; H01L 2224/45099; H01L 2223/6611; H01L 2223/6644; H01L 2223/6655;
(Continued)

(56) References Cited

U.S. PATENT DOCUMENTS 6,005,442 A    12/1999  Maeda et al.
6,201,445 B1    3/2001  Morimoto et al.
(Continued)

OTHER PUBLICATIONS

Bond-wire engineering to improve power performance in multi-cell GaN package devices Halder, S. ; McMacken, J. ; Runton, D. Microwave Symposium Digest (IMS), 2013 IEEE MTT-S International.
(Continued)

*Primary Examiner* — Mohammed Shamsuzzaman

(57) ABSTRACT

A semiconductor die comprising a terminal structure for an active power device. The terminal structure comprises a metallic layer arranged to be electrically coupled between the active power device and an external contact of an integrated circuit package, a conductive sub-structure extending in parallel with the metallic layer, and located such that, when mounted within an integrated circuit device, the conductive sub-structure lies between the metallic layer and a reference voltage plane, and interconnecting elements extending between the metallic layer and the conductive sub-structure and electrically coupling the metallic layer to the conductive sub-structure. The plurality of interconnecting elements comprise first and second interconnecting elements extending between first and second lateral end regions of the metallic layer and the conductive sub-structure respectively such that the first and second interconnecting elements are laterally spaced with respect to the direction of travel of the fundamental signal for the active power device.

8 Claims, 5 Drawing Sheets

(51) Int. Cl.
*H01L 29/78* (2006.01)
*H01L 21/48* (2006.01)

(58) Field of Classification Search
CPC ... H01L 2224/04042; H01L 2224/4813; H01L 23/64; H01L 23/66; H01L 24/48; H01L 24/49; H01L 26/0655; H01L 2924/1305; H01L 2924/13051; H01L 2924/1306; H01L 2924/13; H01L 2924/14; H01L 2924/1421; H01L 2924/30105; H01L 2924/30107; H01L 2924/7816; H01L 23/49811; H01L 23/49827; H01L 23/49844; H01L 21/486
USPC ........ 257/774, 177, 328, 546, 276; 330/295, 330/287; 365/192
See application file for complete search history.

(56) References Cited

U.S. PATENT DOCUMENTS

| | | |
|---|---|---|
| 8,253,495 B2 | 8/2012 | Bouisse |
| 2001/0004115 A1* | 6/2001 | Olofsson ............ H01L 23/4824 257/177 |
| 2005/0190614 A1* | 9/2005 | Brunette .............. H05K 1/0222 365/192 |
| 2012/0133442 A1* | 5/2012 | Blednov ................ H01L 23/64 330/295 |
| 2016/0056765 A1 | 2/2016 | Kim et al. |

OTHER PUBLICATIONS

Feeding structures for packaged multifinger power transistors Breitkreutz, B. ; Ferdinand-Braun-Inst. fur Hochstfrequenztechnik (FBH), Berlin ; Schmiickle, F.J. ; Heinrich, W. Microwave Conference, 2007. European.
Distributed Effects in High Power RF LDMOS Transistors Goverdhanam, K. ; Agere Syst., Allentown, PA, USA ; Wenhua Dai ; Frei, Michel ; Farrell, D. et al Microwave Symposium Digest, 2005 IEEE MTT-S International.
Non-Final Office Action dated Mar. 10, 2016 in U.S. Appl. No. 14/549,756.
Final Office Action dated Sep. 23, 2016 in U.S. Appl. No. 14/549,756.
Non final office action dated Apr. 7, 2017 in U.S. Appl. No. 14/549,756.

* cited by examiner

//  TERMINAL STRUCTURE FOR ACTIVE POWER DEVICE

FIELD OF THE INVENTION

This invention relates to a terminal structure for an active power device.

Background of the Invention

In high power (e.g.>100 W) semiconductor devices, for example LDMOS (laterally diffused metal oxide semiconductor) devices, high frequency (e.g. radio frequency (RF) or microwave frequency) signals within input and output bonding wire arrays can result in mutual electromagnetic coupling between the bonding wire arrays and the underlying ground plane of the semiconductor device. Such mutual electromagnetic coupling can have a harmful effect on high frequency, e.g. RF, return current distribution flow within the ground plane that can cause RF differential lateral current flow and non-uniform RF voltage distribution along input and output bond-bars, even when a uniformly distributed RF voltage is received at the input terminal (lead) of the device package. If physical and electrical dimensions of the active die are large enough, such lateral currents can result in parasitic lateral standing waves occurring along the input and output bond-bars at harmonics of the output frequency $f_o$.

A fundamental RF signal passing through the semiconductor device from the input bond-bar to the output bond-bar will combine with such parasitic lateral standing waves, resulting in a non-uniform combined output voltage and current, which disrupts the uniformity of the impedance seen by input and output of the active device (die). The effect of such parasitic lateral standing waves, even if only of small amplitudes, on the output signal severely degrades linearization of the semiconductor device and, at some extreme occasions, can be destructive to some components of the device structure.

SUMMARY OF THE INVENTION

The present invention provides a semiconductor die, a terminal structure and an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

According to examples of the present invention, there is provided a terminal structure for an active die of radio frequency (RF) power device. The terminal structure is provided with a conductive sub-structure located such that, when mounted within an integrated circuit device, the conductive sub-structure lies between a fundamental signal layer of the terminal structure (through which a fundamental signal (i.e. the 'wanted' signal) of the power device passes) and a reference voltage plane. In this manner, and as described in greater detail below, at least a portion of the lateral currents generated by non-uniformity of lateral RF voltages along the terminal structure will flow through the conductive sub-structure, and not through the fundamental signal. As a result, the lateral currents are able to be (at least partly) separated from the orthogonal fundamental signal. Furthermore, by providing resistive properties within the lateral current flow path of the conductive sub-structure, lateral standing waves and currents occurring within the terminal structure can be dissipated within the conductive sub-structure.

Figure 1:
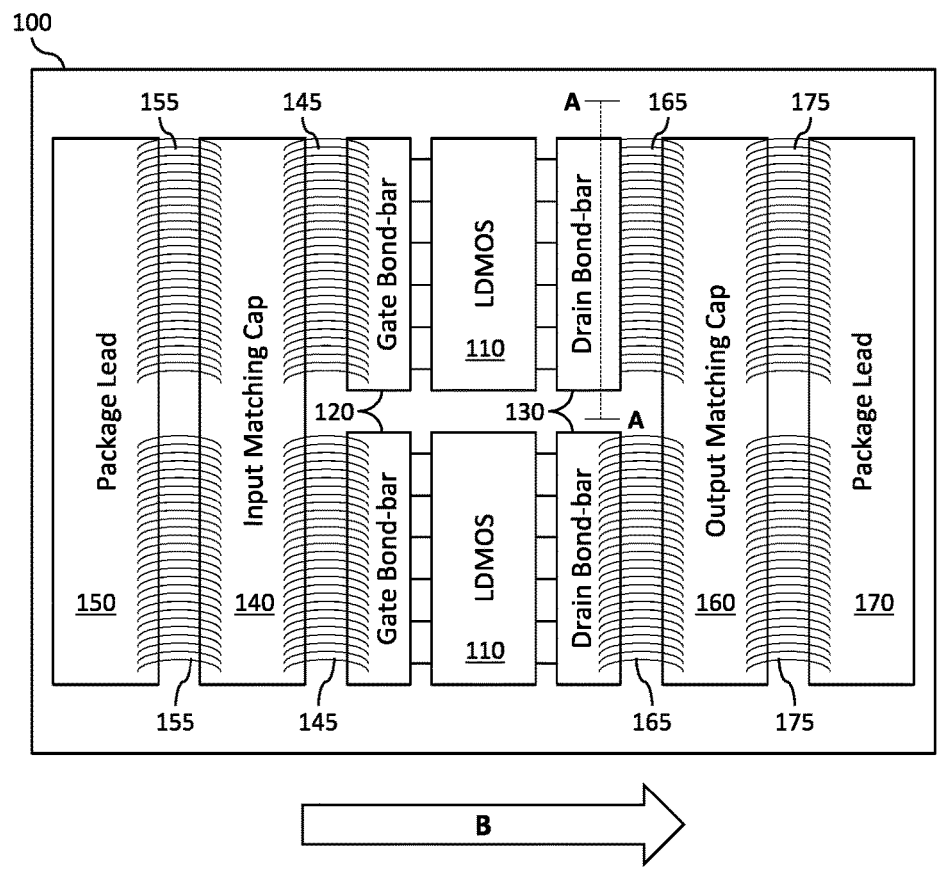
FIG. 1 illustrates a simplified block diagram of an integrated circuit device.

Referring now to FIG. 1, there is illustrated a simplified block diagram of an integrated circuit (IC) device 100 consisting of two active semiconductor power devices 110. In particular, in the illustrated example the IC device 100 consists of two LDMOS transistor devices 110. However, it will be appreciated that in other examples the IC device 100 may consist of other numbers and types of active semiconductor power devices, such as for example, heterojunction bipolar transistor (HBT) devices, pseudomorphic high-electron-mobility transistor (PHEMT) device, Gallium nitride (GaN) devices, bipolar junction transistor (BJT) devices etc.

The LDMOS transistor devices 110 illustrated in FIG. 1 are connected between respective terminal structures consisting of gate bond-bars 120 and drain bond-bars 130. The gate bond-bars 120 are coupled to a first (input) IC package external contact (lead) 150 via bonding wire arrays 145, 155 and an input matching capacitor element 140; the bonding wire arrays 145, 155 and input matching capacitor element 140 providing input matching for the LDMOS transistor devices 110. The drain bond-bars 130 are coupled to a second (output) IC package external contact (lead) 170 via bonding wire arrays 165, 175 and an output matching capacitor element 160; the bonding wire arrays 165, 175 and output matching capacitor element 160 providing output matching for the LDMOS transistor devices 110.

Figure 2:
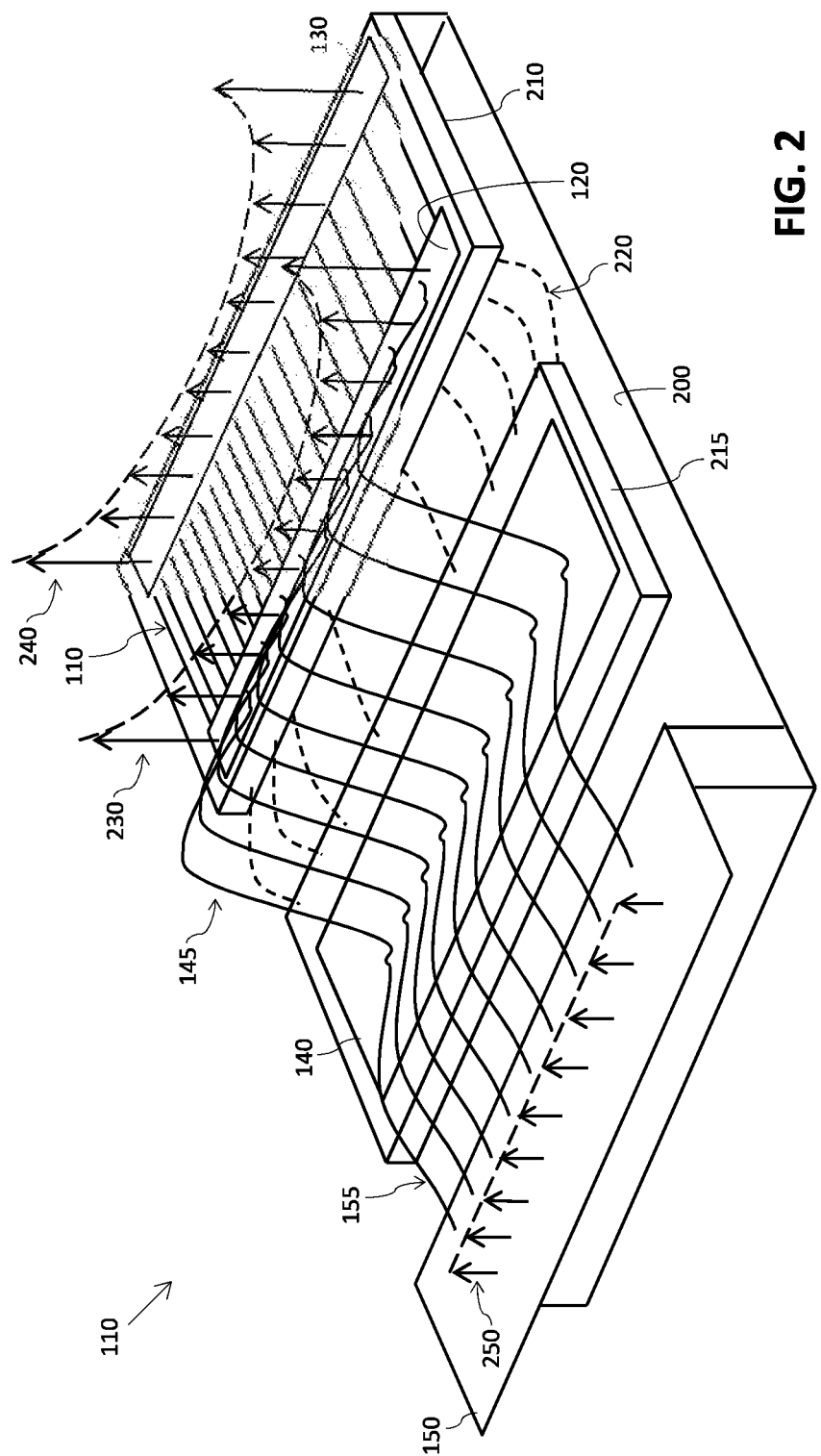
FIG. 2 schematically illustrates an example of an LDMOS transistor device of FIG. 1.

FIG. 2 schematically illustrates an example of one of the LDMOS transistor devices 110 of FIG. 1, and its electrical coupling to the first package lead 150 via the bonding wire arrays 145, 155 and the input matching capacitor element 140 in greater detail.

In the example illustrated in FIG. 2, the active LDMOS transistor device 110 is fabricated on a first semiconductor die 210, along with its respective terminal structures consisting of the gate bond-bar 120 and the drain bond-bar 130. Active power devices, such as LDMOS transistor devices, typically consist of a large number (e.g. 50) of parallel elements, each element having two input 'fingers' and one output 'finger'. As such, each of the input (gate) and output (drain) of the LDMOS transistor device 110 consists of an array of gate/drain fingers arranged in a comb-like structure (not shown). The gate and drain comb-like structures are electrically connected to input and output terminal structures respectively. In the illustrated example, the gate and drain bond-bars 120, 130 form a part of the input and output terminal structures respectively, and provide a structure onto which the bonding wires of the arrays 145, 165 may be bonded in order to electrically couple the gate and drain of the LDMOS transistor device 110 to external package contacts (i.e. package leads 150, 170 in FIG. 1) of the IC device 100. In addition to providing bonding structures for the arrays of bonding wires 145, 165, the input/output terminal structures (gate and drain bond-bars 120, 130) also act as manifolds to feed voltage signals into and out of the gate and drain elements (fingers) of the LDMOS transistor device 110.

The input matching capacitor element 140 is provided on a second semiconductor die 215. Similarly the output matching capacitor element 160 (FIG. 1) may be provided on a third semiconductor die (not shown).

In high frequency applications, such as RF applications or microwave applications, the high frequency signals within the bonding wire arrays 145, 155 result in a mutual electromagnetic coupling between the bonding wire arrays 145, 155 and a ground plane, indicated generally at 200, beneath the bonding wire arrays 145, 155. The mutual electromagnetic coupling between the ground plane 200 and the bonding wire arrays 145, 155 carrying high frequency signals has a distorting effect on current flow within the ground plane 200, as indicated generally by the broken lines 220 in FIG. 2. This effect on the current flow within the ground plane may be described by electromagnetic law, which states that electrical charges moving in the same direction are repelled from one another, resulting in a 'pushing out' of the RF currents within the ground plane 200 to the sides in the area beneath the bonding wire arrays 145, 155, as illustrated by the broken lines 220. This 'pushing out' of the RF currents within the ground plane 200 results in a higher current density of "return" or image RF currents at the sides of the LDMOS transistor device die 210, and a lower current density of "return" or image RF currents at the centre of the LDMOS transistor device die 210, High frequency signals within the bonding wire arrays 165, 175 (FIG. 1) at the output of the LDMOS transistor device 110 also have a similar distorting effect on current flow within the ground plane 200.

This uneven distribution of return RF currents for the LDMOS transistor device die 210 results in an non-uniform distribution of input power drive and source impedance seen by the input of the LDMOS transistor device 110, which becomes more prominent with increasing size of the active die and the frequency of operation. As a result, the output of the LDMOS transistor device 110 generates an output current and output RF power that replicates the profile of the input power drive, resulting in a non-uniform output power level distribution along the output of the LDMOS transistor device die 210.

It should be also noted that the input drive profile may be non-symmetrical due to non-consistent grounding of the power device flange, or non-consistent input power distribution at the device's input lead due to the spread of PCB (printed circuit board) matching network parameters in the production line. The same applies to the output lead of the device. In such a situation there is a relatively high probability that the RF signal voltage at the input or the output bond-bar 120, 130 of the active LDMOS transistor device 110 will be asymmetrical.

Non-uniform power level distributions along at the input and output of the LDMOS transistor device die 210 causes non-uniform lateral RF voltage distributions along the bond-bars 120, 130. For large scale devices, for example having gate widths >70 mm, such non-uniform RF voltage distribution can result in lateral standing wave voltages 230, 240 occurring along the bond-bars 120, 130 at harmonics of the fundamental signal frequency $f_o$. As a result of such non-uniform RF voltage distributions, a differential RF current starts to flow along the respective bond-bar 120, 130 from points of higher voltage potential to the point where the voltage potential is at its lowest at a given moment of time.

Recent experiments have shown that the addition of frequency selective circuits between active die outputs can help to overcome the distorting effects on current caused by the mutual electromagnetic coupling of bonding wires within input and output arrays. However, such circuits require significant die area on the active die, which reduces the device power density and is contrary to the continual drive towards improving die scaling without compromising stability. A further limitation of such frequency selective circuits is that they are only capable of efficient rejection of the one harmonic of the output frequency $f_o$, whereas it is desirable to eliminate all harmonics which can trigger lateral standing waves. A still further limitation of such frequency selective circuits is that they require fine tuning of bond-wire shape to operate at a required harmonic of the output frequency $F_o$.

Figure 3:
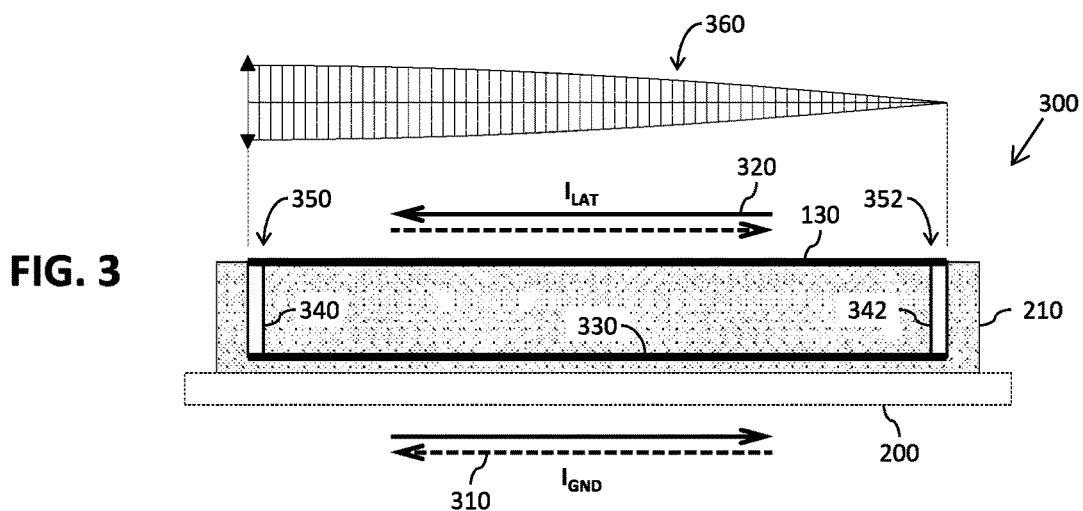
FIG. 3 illustrates a simplified cross-sectional view of an example of an output terminal structure for an active die of an LDMOS transistor device.

FIG. 3 illustrates a simplified cross-sectional view along the dashed line A:A in FIG. 1 of an example of an output terminal structure 300 for the LDMOS transistor device 110. As mentioned above, the output terminal structure 300 includes the drain bond-bar 130, which consists of a metallic layer electrically coupled between the active LDMOS transistor device 110 and an external contact (e.g. the package lead 170 in FIG. 1). The metallic layer of the drain bond-bar 130 provides a fundamental signal layer of the terminal structure 300 (through which a fundamental signal of the LDMOS transistor device 110 passes) and extends laterally across the semiconductor die 210 with respect to a direction of travel (indicated by the arrow B in FIG. 1) of the fundamental signal for the LDMOS transistor device 110 (i.e. a signal travelling from input to output of the active LDMOS transistor device 110).

In the illustrated example of FIG. 3, the output terminal structure 300 further includes a conductive sub-structure 330 extending in parallel with the drain bond-bar 130 and located such that, when mounted within the integrated circuit device 100, the conductive sub-structure 330 lies between the drain bond-bar 130 and the ground plane 200, which for LDMOS devices consists of a highly doped conductive body of silicon. In the example illustrated in FIG. 3, the conductive sub-structure 330 consists of a further metallic layer.

A plurality of interconnecting elements 340, 342 (two in the example of FIG. 3) extend between the drain bond-bar 130 and the conductive sub-structure layer 330, and electrically couple the metallic layer of the drain bond-bar 130 to the conductive sub-structure layer 330. A first interconnecting element 340 extends between a first lateral end region 350 of the metallic layer of the drain bond-bar 130 and the conductive sub-structure layer 330. A second interconnecting element 342 extends between a second lateral end region 352 of the metallic layer of the drain bond-bar 130 and the conductive sub-structure layer 330. In this manner, the first and second interconnecting elements 340, 342 are laterally spaced across the output terminal structure 300 with respect to the direction of travel (indicated by the arrow B in FIG. 1) of the fundamental signal for the LDMOS transistor device 110.

As previously described above with reference to FIG. 2, high frequency signals within the bonding wire arrays 145, 155, 165, 175 have a distorting effect on the current flow within the ground plane 200. This distorting effect can result in a non-uniform lateral RF voltage distribution along the terminal structures (e.g. the gate and drain bond-bars 120, 130). For a large scale active LDMOS transistor device 110, for example consisting of a total output (drain) finger periphery length of Wg=100 mm and having a 5 mm physical width output bond-bar 130, the output bond-bar 130 may be represented laterally by an artificial transmission line, with the drain-source capacitance represented as capacitances distributed along the transmission line. The (lateral) impedance for such a large scale metallic bond-bar 130 may be estimated as Zo=4.35 Ohm. Accordingly, with such low impedance, the bond-bar 130 provides a high quality resonator for laterally propagating high frequency signals, such as those that might be induced within the output terminal structure 300 as a result of the distorting effect on the ground plane 200 from high frequency (e.g. RF) signals within the arrays of bonding wires 145, 155, 165, 175. For a high frequency signal of 3.5 GHz, a 100 mm output bond-bar 130 would have a length equal to 90° of the high frequency signal (i.e. a quarter of a wavelength). Accordingly, a fundamental signal for the LDMOS transistor device 110 having a frequency $f_o$ of, for example, 1.75 GHz would induce a lateral current ($I_{LAT}$) 320 within the output terminal structure 300 having a frequency at a second harmonic of the fundamental frequency $2f_o$ of 3.5 GHz. In the above example, where the total drain finger periphery length of Wg=100 mm is equal to 90° of such a lateral current frequency $2f_o$, a lateral standing wave will occur within the bond-bar 130, as illustrated at 360.

A non-uniform lateral RF voltage distribution across the output terminal structure 300 produces a lateral RF current flow ($I_{LAT}$) within the output terminal structure 300, as indicated generally at 320. This lateral RF current flow ($I_{LAT}$) 320 within the output structure 300 induces a corresponding image (opposite) lateral RF current flow ($I_{GND}$) within the ground plane 200, as indicated generally at 310.

According to Maxwell's equations, the opposing differential RF currents ($I_{GND}$) 310 and ($I_{LAT}$) 320 flowing within the ground plane 200 and the output terminal structure 300 will be attracted towards each other. Thus, by providing the conductive sub-structure 330 between the drain bond-bar 130 and the ground plane 200, the lateral current flow ($I_{LAT}$) within the output terminal structure 300 will be more inclined to flow through the conductive sub-structure 330 than through the drain bond-bar 130 due to the attraction towards the opposing current ($I_{GND}$) 310 within the ground plane 200. In this manner, the lateral currents ($I_{LAT}$) 320 within the output terminal structure 300 may be (at least partially) separated from the fundamental signal of the LDMOS transistor device 110 travelling through the drain bond-bar 130 in an orthogonal direction relative to the lateral currents ($I_{LAT}$) 320.

The closer the conductive sub-structure 330 is to the ground plane 200, the greater the pull of the lateral currents ($I_{LAT}$) 320 into the conductive sub-structure 330 due to the attraction between the opposing differential currents ($I_{GND}$) 310 and ($I_{LAT}$) 320, and thus the greater the proportion of the lateral currents ($I_{LAT}$) 320 that will flow within the conductive sub-structure 330 relative to within the drain bond-bar 130. Accordingly, in some examples the conductive sub-structure 330 is arranged to be located closer to the ground plane 200 than then drain bond-bar 130, as illustrated in FIG. 3.

The differential lateral currents ($I_{LAT}$) 320 within the output terminal structure 300 may be attenuated by providing resistive properties within the current flow path. Accordingly, in some examples the interconnecting elements 340, 342 or the conductive sub-structure 330 (or both) are arranged to have resistive properties that attenuate the lateral currents ($I_{LAT}$) 320 flowing there through, and thus dissipate the energy within the standing wave 360. For example, the interconnecting element 340, 342 may consist of resistive elements. In alternative examples, one or more resistive elements may be formed within the conductive sub-structure 330. In further alternative examples, the conductive sub-structure may be formed from one or more metallic layers having resistive properties.

In some examples, the interconnecting elements 340, 342 and the conductive sub-structure are arranged to provide an impedance at each end of the drain bond-bar 130 that matches the characteristic lateral impedance of the metallic layer of the drain bond-bar 130, as represented laterally by an artificial transmission line. In this manner, the metallic layer of the drain bond-bar 130 acts as a transmission line having ends that have been terminated by matched impedances. As a result, reflections of the differential lateral currents ($I_{LAT}$) 320 flowing within the drain bond-bar 130 may be substantially removed, thereby effectively removing the lateral standing wave(s).

As described above, FIG. 3 illustrates a simplified cross-sectional view of an example of an output terminal structure 300 for the LDMOS transistor device 110 for dissipating a lateral standing wave 360 having a quarter wavelength equal to the width of the drain bond-bar 130. For example, a fundamental signal for the LDMOS transistor device 110 having a frequency $f_o$ of, for example, 1.75 GHz would induce a lateral current ($I_{LAT}$) 320 within the output terminal structure 300 having a frequency at a second harmonic of the fundamental frequency $2f_o$ of 3.5 GHz, resulting in a lateral current frequency $2f_o$ generating the standing wave 360 having a quarter wavelength equal to a bond-bar width of 100 mm.

When considering the input (gate) of an active device such as the LDMOS transistor device 110, due to a higher parasitic capacitance Cgs between the input (gate) and the ground plane 200, the characteristic lateral impedance of the input (gate) bond-bar 120 will be lower than that of the output (drain) bond-bar 130, resulting in an electrical length for the input (gate) bond-bar 120 at the same frequency that is going to be approximately $$\sqrt{\frac{c}{c}}$$

larger than for the output (drain) bond-bar 130. As a result, a standing wave may appear along the input (gate) bond-bar 120 at a lower frequency than at output (drain) bond-bar 130. The specific distributed inductance per length and capacitance defines the equivalent parameters of the input and output bond-bar 120, 130 in terms of lateral transmission line, and accordingly the signal propagation constant and wavelength.

Figure 4:
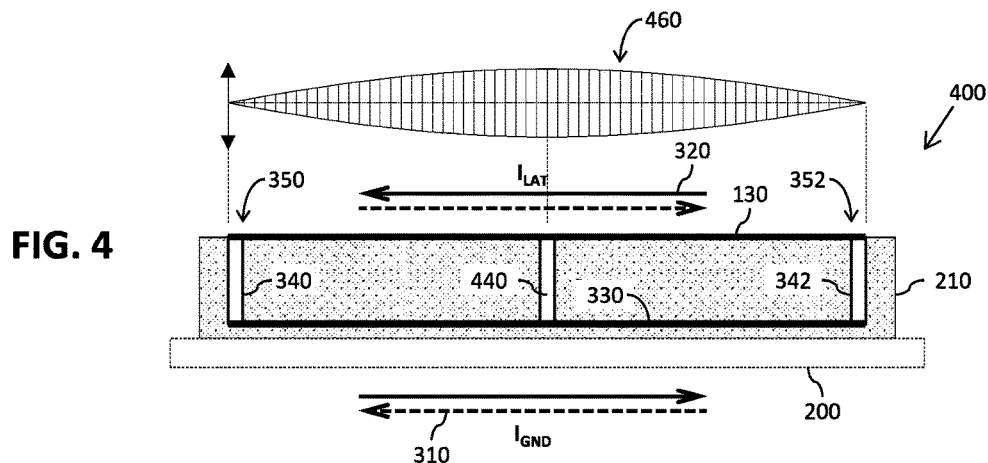
FIG. 4 illustrates a simplified cross-sectional view of an alternative example of an output terminal structure for an active die of an LDMOS transistor device.

FIG. 4 illustrates a simplified cross-sectional view along the dashed line A:A in FIG. 1 of an alternative example of an output terminal structure 400 for the LDMOS transistor device 110 for dissipating a lateral standing wave 460 having a half wavelength equal to the width of the drain bond-bar 130. For example, a fundamental signal for the LDMOS transistor device 110 having a frequency $f_o$ of, for example, 1.75 GHz would induce a lateral current ($I_{LAT}$) 320 within the output terminal structure 300 having a frequency at a fourth harmonic of the fundamental frequency $4f_o$ of 7 GHz, resulting in a lateral current frequency $4f_o$ generating the standing wave 460 having a half wavelength equal to a bond-bar width of 100 mm.

The output terminal structure 400 illustrated in FIG. 4 includes the drain bond-bar 130, which consists of a metallic layer extending laterally across the semiconductor die 210 with respect to the direction of travel (indicated by the arrow B in FIG. 1) of a fundamental signal for the LDMOS transistor device 110. The output terminal structure 400 further includes a conductive sub-structure 330 extending in parallel with the drain bond-bar 130 and located such that, when mounted within the integrated circuit device 100, the conductive sub-structure 330 lies between the drain bond-bar 130 and the ground plane 200. In the example illustrated in FIG. 4, the conductive sub-structure 330 consists of a further metallic layer.

First and second interconnecting elements 340, 342 extend between end regions 350, 352 of the drain bond-bar 130 and the conductive sub-structure layer 330, and electrically couple the end regions 350, 352 of the metallic layer of the drain bond-bar 130 to the conductive sub-structure layer 330. In some examples, the first and second interconnecting elements 340, 342 and the conductive sub-structure 330 are arranged to provide an impedance at each end of the drain bond-bar 130 that matches the lateral impedance of the metallic layer of the drain bond-bar 130. In this manner, the metallic layer of the drain bond-bar 130 acts as a transmission line having ends that have been terminated by matched impedances. As a result, reflections of the differential lateral currents ($I_{LAT}$) 320 flowing within the drain bond-bar 130 may be substantially removed, thereby effectively removing the lateral standing wave(s).

In practice, it is difficult to perfectly match the impedances provided by the first and second interconnecting elements 340, 342 and the conductive sub-structure 330 at the ends of the drain bond-bar 130. As such, it is difficult to completely remove reflections of the differential lateral currents ($I_{LAT}$) 320 flowing within the drain bond-bar 130. In some examples one or more further interconnecting elements may be provided between the drain bond-bar 130 and the conductive sub-structure 330, for example at locations of anticipated voltage peak for lateral standing waves. For example, and as illustrated in FIG. 4, for the standing wave 460 having a half wavelength equal to the width of the drain bond-bar 130, the standing wave 40 has a peak voltage located half way along the drain bond-bar 130. Accordingly, the output terminal structure 400 consists of a further interconnecting element 440 located halfway between the end regions 350, 352 of the bond-bar 130, at a voltage peak for the standing wave 460.

The provision of such additional interconnecting elements 440 located at voltage peak locations along the terminal structure 400 facilitates the draw of the lateral current flow ($I_{LAT}$) 320 within the output terminal structure 400 towards the image lateral current ($I_{GND}$) 310 within the ground plane 200. As a result, a larger proportion of the lateral differential current flow ($I_{LAT}$) within the terminal structure 400 occurs within the conductive sub-structure 330, reducing the lateral differential current flow ($I_{LAT}$) 320 within the drain bond-bar 130.

Figure 5:
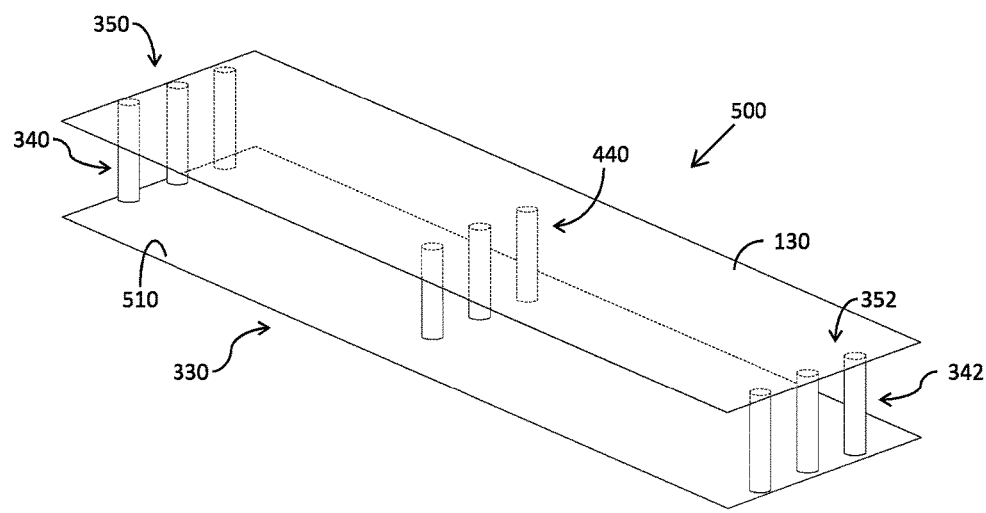
FIG. 5 illustrates a simplified perspective view of an example of a terminal structure for an active power device die.

FIG. 5 illustrates a simplified perspective view of an example of a terminal structure 500 for an active power device, such as may be used to implement the example output terminal structures 300, 400 of the LDMOS transistor device 110 illustrated in FIGS. 3 and 4. The terminal structure 500 illustrated in FIG. 5 includes a fundamental signal layer arranged to be electrically coupled between the active power device and an external contact of an integrated circuit package, such as one of package leads 150, 170 in FIG. 1. In the illustrated example, the fundamental signal layer has been indicated as providing the drain bond-bar 130 of the LDMOS device 100, and as such consists of a metallic layer. In some examples, the fundamental signal layer (the drain-bond bar in the illustrated example) 130 of the terminal structure 500 is coupled to an external contact via one or more matching components, for example to package lead 170 via bonding wire arrays 165, 175 and matching capacitor element 160 as illustrated in FIG. 1.

The terminal structure 500 illustrated in FIG. 5 further includes a conductive sub-structure 330 extending in parallel with the drain-bond bar 130. The conductive sub-structure 330 is located such that, when mounted within an integrated circuit device, the conductive sub-structure 330 lies between the fundamental signal layer 130 and a reference voltage plane of the active power device, for example a ground plane. In some examples, the conductive sub-structure 330 is arranged to lie closer to the reference voltage plane of the active power device than to the drain-bond bar 130.

The conductive sub-structure 330 is electrically coupled to the drain-bond bar 130 by way of a plurality of interconnecting elements 340, 342, 440 extending there between. In particular for the example illustrated in FIG. 5, a first set of interconnecting elements 340 extend between a first lateral end region 350 of the drain-bond bar 130 and the conductive sub-structure 330, a second set of interconnecting elements 342 extend between a second lateral end region 352 of the drain-bond bar 130 and the conductive sub-structure 330, and a further set of interconnecting elements 440 located halfway between the end regions 350, 352 of the drain-bond bar 130, at a voltage peak for an anticipated standing wave, and extending between the fundamental signal layer 130 and the conductive sub-structure 330.

In the example illustrated in FIG. 5, the conductive sub-structure 330 consists of a second metallic layer 510 arranged to extend the length of the fundamental signal layer (the drain-bond bar in the illustrated example) 130, and in some examples is of generally the same dimensions as the drain-bond bar 130 and located directly between the drain-bond bar 130 and (when in situ) a reference voltage plane (not shown) of the active power device. In this manner, the conductive sub-structure layer 510 is located closer to the reference voltage plane, and is coupled to the drain-bond bar 130 at several points, including at the lateral end regions 350, 352 of the fundamental signal layer 130, by the interconnecting elements 340, 342, 440.

As described above, lateral high frequency currents flowing within such a terminal structure 500 will be drawn down into the conductive sub-structure layer 510 as a result of the mutual attraction between the differential lateral RF currents ($I_{GND}$) 310 and ($I_{LAT}$) 320 (illustrated in FIG. 3) flowing within the reference plane and the output terminal structure 500. In some examples, the conductive sub-structure 330 and the plurality of interconnecting elements 340, 342, 440 are arranged to provide a resistive path for such lateral currents flowing within the terminal structure. For example, the interconnecting elements 340, 342, 440 may consist of resistive components, or the conductive sub-structure layer 510 itself may be formed such that it provides a resistive path for lateral currents flowing there through. For example, the conductive sub-structure layer 510 may be formed of a thin metallic layer of low conductivity. In this manner, lateral differential high frequency currents flowing within such a terminal structure 500 will be drawn down into the conductive sub-structure layer 510 and will be absorbed by the resistive path provided by the conductive sub-structure layer 510 and the plurality of interconnecting elements 340, 342, 440, thereby separating the lateral high frequency currents from the currents of the fundamental signal flowing within the drain bond-bar 130 (flowing orthogonally with respect to the lateral currents).

In some examples, the interconnecting elements 340, 342 coupled to the end regions 350, 352 of the drain-bond bar 130 and the conductive sub-structure 330 are arranged to provide an impedance at each end of the drain bond-bar 130 that matches the lateral impedance of the drain-bond bar 130. In this manner, the drain-bond bar 130 acts as a transmission line having ends that have been terminated by matched impedances. As a result, reflections of the differential lateral currents flowing within the drain-bond bar 130 may be substantially removed, thereby effectively removing the lateral standing wave(s).

Figure 6:
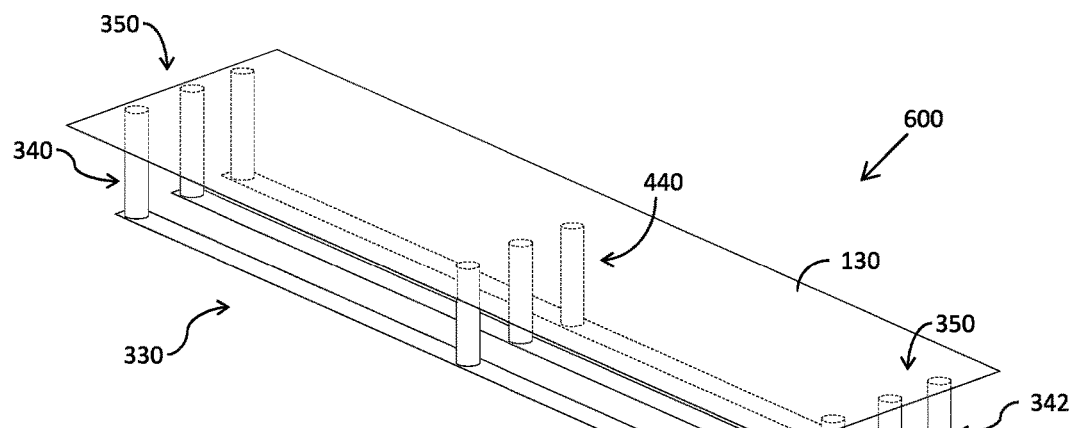
FIG. 6 illustrates a simplified perspective view of an alternative example of a terminal structure for an active power device die.

FIG. 6 illustrates a simplified perspective view of an alternative example of a terminal structure 600 for an active power device, such as may be used to implement the example output terminal structures 300, 400 of the LDMOS transistor device 110 illustrated in FIGS. 3 and 4. The terminal structure 600 illustrated in FIG. 6 differs from the terminal structure 500 of FIG. 5 in that the conductive sub-structure 330 consists of a plurality of narrow metallic strips 610, 612, 614 arranged to extend the length of the fundamental signal layer 130, between the fundamental signal layer 130 and a reference voltage plane (not shown) of the active power device. In this manner, the conductive sub-structure layers 610, 612, 614 are located closer to the reference voltage plane, and are coupled to the fundamental signal layer 130 at several points, including at the lateral end regions 350, 352 of the fundamental signal layer 130, by the interconnecting elements 340, 342, 440.

By implementing the conductive sub-structure 330 as a plurality of narrow metallic strips 610, 612, 614 in this manner, the parasitic capacitance added between the input/output of the active device and the reference voltage plane (Cds in the case of an output/drain terminal structure for an LDMOS transistor device) is reduced. Furthermore, the flow of current for the orthogonal fundamental signal through these narrow strips 610, 612, 614 will be limited by the narrow widths of the metallic strips 610, 612, 614 as compared with the single, broader metallic layer 510 of FIG. 5, whilst providing a resistive path for lateral standing wave dissipation.

Figure 7:
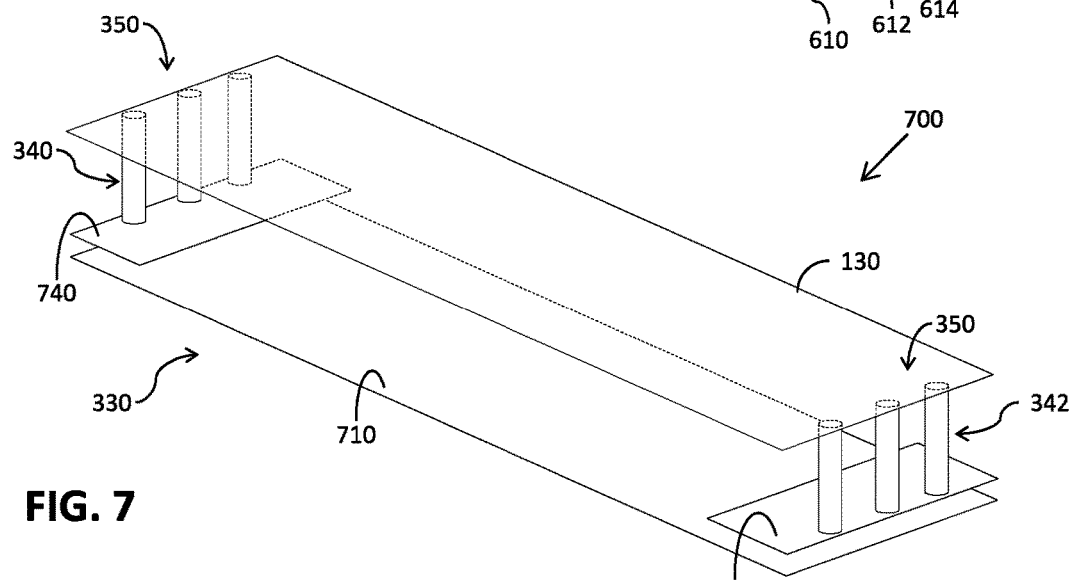
FIG. 7 illustrates a simplified perspective view of a further alternative example of a terminal structure for an active power device die.

FIG. 7 illustrates a perspective view of a further alternative example of a terminal structure 700 for an active power device, such as may be used to implement the example output terminal structures 300, 400 of the LDMOS transistor device 110 illustrated in FIGS. 3 and 4 The conductive sub-structure 330 of the terminal structure 700 illustrated in FIG. 7 consists of a metallic layer 710, arranged to extend the length of the fundamental signal layer 130, between the fundamental signal layer 130 and a reference voltage plane (not shown) of the active power device. In this manner, the metallic layer 710 of the sub-structure 330 is located closer to the reference voltage plane than the fundamental signal layer 130, and is coupled to the fundamental signal layer 130 at several points, including at the lateral end regions 350, 352 of the fundamental signal layer 130, by the interconnecting elements 340, 342.

The terminal structure 700 illustrated in FIG. 7 differs from the terminal structures 500, 600 of FIGS. 5 and 6 in that the interconnecting elements 340, 342 are arranged to capacitively couple the fundamental signal layer 130 to the metallic layer 710 of the sub-structure. For example, and as illustrated in FIG. 7, for each set of interconnecting elements 340, 342, a series capacitance is created between the metallic layer 710 of the sub-structure 330 and a further (series-capacitance) metallic layer 740, 742. Each of the series-capacitance metallic layers 740, 742 is separated from the metallic layer 710 of the sub-structure 330 by a dielectric (not shown), for example silicon oxide. By forming the series-capacitance metallic layers 740, 742 and the metallic layer 710 of the sub-structure 330 such that the capacitances there between permit the harmonic frequencies of the high frequency fundamental signals of the active power device to pass there through, the high frequency lateral currents flowing within the terminal structure 700 are able to pass through the series capacitances of the interconnecting element 340, 342 into the metallic layer 710 of the sub-structure 330, whilst lower frequency signals, for example such as DC bias voltages etc., are blocked. Advantageously, in such a terminal structure 700, an un-balanced or non-uniform fundamental signal is protected from being dissipated within the sub-structure 330 due to the low-frequency blocking properties of the series capacitances.

Although not illustrated in FIG. 7, it is contemplated that such capacitive coupling of the interconnecting elements may also be implemented for interconnecting elements at locations of anticipated voltage peak for lateral standing waves, such as the interconnecting elements 440 located halfway between the end regions 350, 352 of the fundamental signal layer 130 in FIGS. 4 to 6. Furthermore, it is contemplated that such capacitive coupling by the interconnecting elements may equally be implemented for a conductive sub-structure 330 consisting of multiple metallic strips, such as the conductive sub-structure 330 illustrated in FIG. 6.

Figure 8:
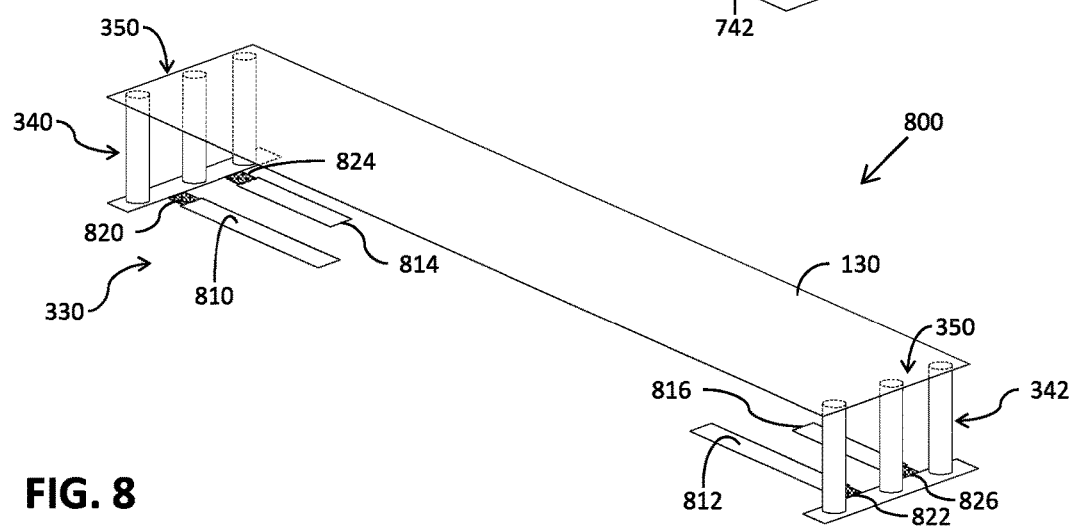
FIG. 8 illustrates a simplified perspective view of a still further alternative example of a terminal structure for an active power device die.

FIG. 8 illustrates a perspective view of a still further alternative example of a terminal structure 800 for an active power device, such as may be used to implement the example output terminal structures 300, 400 of the LDMOS transistor device 110 illustrated in FIGS. 3 and 4. The conductive sub-structure 330 of the terminal structure 800 illustrated in FIG. 8 consists one or more pairs of open ended metallic stubs 810, 812, 814, 816. Each pair of open ended metallic stubs consists of a first open ended metallic stub 810, 814 electrically coupled to the first lateral end region 340 of the fundamental signal layer 130 and a second open ended metallic stub 812, 816 electrically coupled to the second lateral end region 342 of the fundamental signal layer 130. In the example illustrated in FIG. 8, the conductive sub-structure 330 of the terminal structure 800 illustrated in FIG. 8 consists of two pairs of open ended metallic stubs 810, 812, 814, 816, which may be tuned for two or more different (undesired) harmonic frequencies or frequency bandwidths. According to electromagnetic theory, these open stubs connected to the lateral end regions 350, 352 of the output bond-bar 130 (or even to the middle of the output bond-bar 130) may terminate and suppress only those frequencies to which they are tuned, without affecting the desired fundamental RF signal power and efficiency of the device.

Each open ended metallic stub 810, 812, 814, 816 is arranged to be tuned for a particular frequency at which a lateral standing wave may occur along the terminal structure 800. For example, each open ended metallic stub 810, 812, 814, 816 may have an electrical length equal to n*90° (i.e. has a multiple of a quarter wavelength) of a particular frequency at which a lateral standing wave may occur. For example, the first pair of open ended metallic stubs 810, 812 may be tuned to a second harmonic of the fundamental frequency $2f_o$ for the active power device, whilst the second pair of open ended metallic stubs 814, 816 may be tuned to a third harmonic of the fundamental frequency $3f_o$ for the active power device. By tuning the open ended metallic stubs 810, 812, 814, 816 to a particular frequency, the open ended metallic stubs 810, 812, 814, 816 provide very low impedance for lateral signals having frequencies around that to which the open ended metallic stubs 810, 812, 814, 816 are tuned. As such, lateral currents flowing within the terminal structure 800 having frequencies around that to which a pair of open ended metallic stubs 810, 812, 814, 816 are tuned will be drawn into said open ended metallic stubs 810, 812, 814, 816. Accordingly, the open ended metallic stubs 810, 812, 814, 816 will terminate the fundamental signal layer 130 for lateral signals within the terminal structure 800 having respective frequencies.

In the example illustrated in FIG. 8, the open ended metallic stubs 810, 812, 814, 816 are connected to the interconnecting elements 340, 342 by resistive elements 820, 822, 824, 826 that attenuate the lateral currents flowing there through, and thus dissipate the energy within a respective standing wave along the terminal structure 800.

In some alternative examples, the open ended metallic stubs 810, 812, 814 may be connected to the interconnecting elements 340, 342 directly. In this manner, quarter-wave length open ended metallic stubs 810, 812, 814 may be implemented without the resistive elements 820, 822, 824, 826), allowing high Q termination for certain harmonics available at the output bond-bar 130 of the LDMOS transistor device 110. For example, if the metallic stubs 810, 812, 814 are tuned for even harmonics (2fo, 4fo, etc.) of the fundamental signal frequency, a short circuit termination is provided for such even harmonics by the open ended metallic stubs 810, 812, 814, allowing for F-class amplifier operation of the LDMOS transistor device 110. Conversely, if the metallic stubs 810, 812, 814 are tuned for odd harmonics of the fundamental signal frequency, a short circuit termination is provided for such odd harmonics by the open ended metallic stubs 810, 812, 814, allowing for inverse F-class amplifier operation of the LDMOS transistor device 110.

Figure 9:
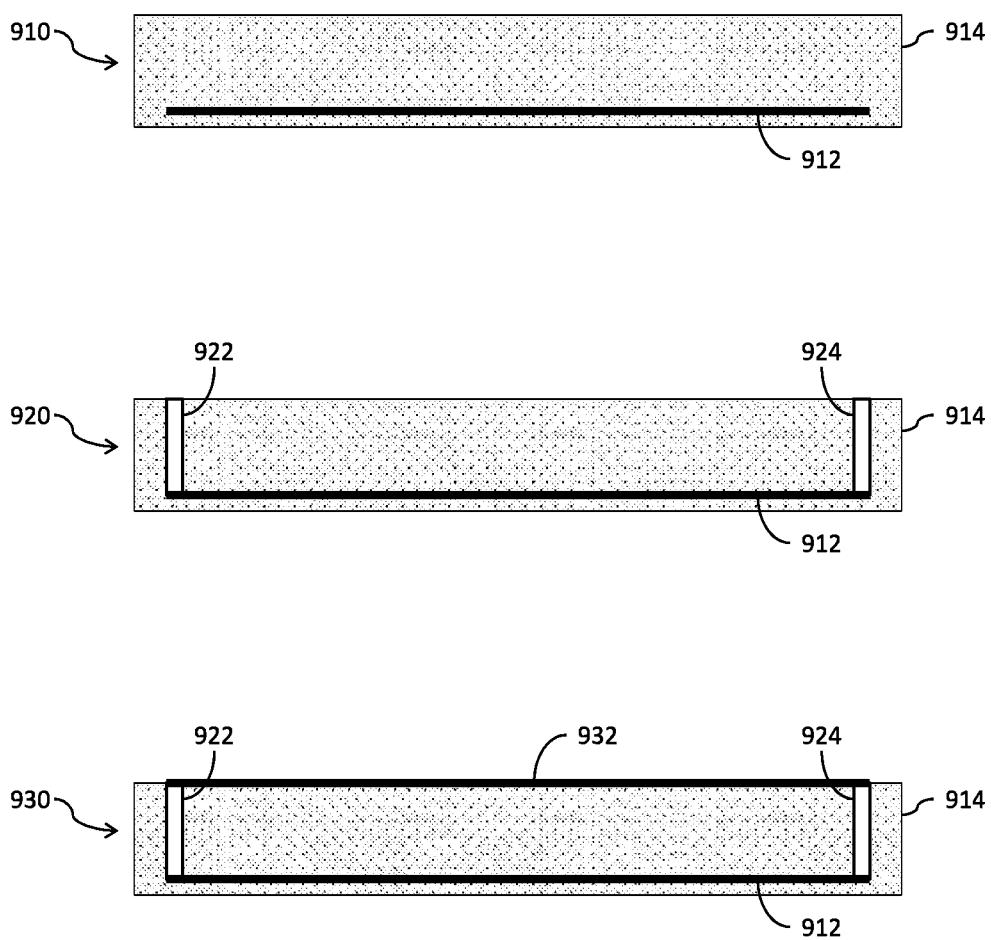
FIG. 9 illustrates a series of build-up figures showing a simplified example of a method of fabricating a terminal structure for an active power device within a semiconductor die.

FIG. 9 illustrates a series of build-up figures showing a simplified example of a method of fabricating a terminal structure for an active power device within a semiconductor die, such as may be used to fabricate any one of the terminal structures illustrated in FIGS. 3 to 8.

The method starts at 910, where a conductive sub-structure 914 is formed within a semiconductor substrate 912 of the semiconductor die. For example, the conductive sub-structure 914 may consist of a metallic layer formed on a first semiconductor material layer, with a second semiconductor material layer being bonded to the first semiconductor material layer to form the semiconductor substrate 912 such that the metallic layer of the conductive sub-structure 914 is sandwiched between the two semiconductor material layers.

In the example illustrated in FIG. 9, a plurality of interconnecting elements in the form of vias 922, 924 are then formed at 920 extending down (from the perspective of the orientation illustrated in FIG. 9, through the semiconductor substrate 912 to the conductive sub-structure 914.

In the example illustrated in FIG. 9, a fundamental signal layer 932 is then formed on a surface of the semiconductor substrate 912, at 930. The fundamental signal layer 932 is arranged to be electrically coupled between an active power device and an external contact of the integrated circuit package.

The conductive sub-structure 914 is formed such that it extends in parallel with the fundamental signal layer 932, and located such that, when mounted within an integrated circuit device, the conductive sub-structure 914 lies between the fundamental signal layer 932 and a reference voltage plan.

The interconnecting elements 922, 924 are formed such that they extend between the fundamental signal layer 932 and the conductive sub-structure 914, and electrically couple the fundamental signal layer 932 to the conductive sub-structure 914. A first interconnecting element 912 is formed to extend between a first lateral end region of the fundamental signal layer 932 and the conductive sub-structure 914, and a second interconnecting element 924 is formed to extend between a second lateral end region of the fundamental signal layer 932 and the conductive sub-structure 914 such that the first and second interconnecting elements 922, 924 are laterally spaced with respect to the direction of travel of a fundamental signal.

In some examples, the conductive sub-structure 912 and the interconnecting elements 922, 924 are formed to provide a resistive path for lateral currents flowing within the terminal structure.

In some examples, the conductive sub-structure 912 and the first and second interconnecting elements 922, 924 are formed to provide an impedance at each of a first and a second end of the fundamental signal layer 932 that matches the lateral impedance of the fundamental signal layer 932.

In some examples, one or more interconnecting element(s) (not shown) are formed at a location of a voltage peak for one or more lateral standing wave(s) within the terminal structure.

In some examples, the conductive sub-structure 912 is formed of one or more metallic layer(s) extending in parallel with the fundamental signal layer 932, and located such that when mounted within an integrated circuit device the metallic layer(s) of the conductive sub-structure 912 lies between the fundamental signal layer 932 and a reference voltage plane (not shown).

In some examples, the, or each, metallic layer of the conductive sub-structure 912 is formed such that it is located closer to the reference voltage plane (not shown) than the fundamental signal layer 932, when mounted within an integrated circuit device.

In some examples, the, or each, metallic layer of the conductive sub-structure 912 is formed to extend the length of the fundamental signal layer 932.

In some examples, the conductive sub-structure 912 is formed of a plurality of metallic strips extending in parallel with the fundamental signal layer 932, and located such that when mounted within an integrated circuit device the metallic strips lie in a plane between the fundamental signal layer 932 and a reference voltage plane (not shown).

In some alternative examples, interconnecting elements are formed to capacitively couple the fundamental signal layer 932 to the conductive sub-structure 912.

In some alternative examples, the conductive sub-structure 912 is formed of one or more pair(s) of open ended metallic stubs, each pair of open ended metallic stubs being tuned to a particular frequency and having a first open ended metallic stub electrically coupled to the first lateral end region of the fundamental signal layer 932 and a second open ended metallic stub electrically coupled to the second lateral end region of the fundamental signal layer 932.

Various examples of the present invention have been herein described with reference to the accompanying drawings, whereby a terminal structure for an active power device is provided with a conductive sub-structure located such that, when mounted within an integrated circuit device, the conductive sub-structure lies between a fundamental signal layer of the terminal structure (through which a fundamental signal of the active power device passes) and a reference voltage plane. In this manner, at least a proportion of the lateral currents generated by non-uniformity of lateral RF voltages along the terminal structure will flow through the conductive sub-structure, and not through fundamental signal layer through which a fundamental signal of the active power devices passes. In this way the two orthogonal RF signals (the fundamental signal and the lateral signal) and their currents can be separated from each other. Furthermore, by providing resistive properties within the lateral current flow path of the conductive sub-structure, a lateral standing wave and current can be dissipated within the conductive sub-structure.

Although standing waves along terminal structures have been described herein as being caused by the distorting current flow effect within the underlying ground plane of high frequency signals within bond wire arrays, it will be understood that standing wave may be generated and appear within terminal structures as a consequence of any voltage non-uniformity existing across the terminal structures, such as from erratic device input drive, non-consistent performance of active device elements, etc.

Furthermore, although the terminal structures herein described have for the most part been described with reference to the output terminal structure of the LDMOS device 110, it is to be understood that the present invention may equally be applied to an input terminal structure.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein, targeting bifurcation, device instability, parametric oscillation or even high efficiency class operation like F-class, without departing from the scope of the invention as set forth in the appended claims and that the claims are not limited to the specific examples described above.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. A semiconductor die comprising at least one active power device and at least one terminal structure; the at least one terminal structure comprising:
    a fundamental signal layer arranged to be electrically coupled between the at least one active power device and an external contact of an integrated circuit package;
    a conductive sub-structure extending in parallel with the fundamental signal layer, and located such that, when mounted within an integrated circuit device, the conductive sub-structure lies between the fundamental signal layer and a reference voltage plane, wherein the conductive sub-structure comprises a plurality of metallic strips extending in parallel with the fundamental signal layer, and located such that when mounted within an integrated circuit device the metallic strips lie in a plane between the fundamental signal layer and a reference voltage plane; and
    a plurality of interconnecting elements extending between the fundamental signal layer and the conductive sub-structure, and electrically coupling the fundamental signal layer to the conductive sub-structure, wherein the plurality of interconnecting elements comprise
    a first interconnecting element extending between a first lateral end region of the fundamental signal layer and the conductive sub-structure; and
    a second interconnecting element extending between a second lateral end region of the fundamental signal layer and the conductive sub-structure such that the first and second interconnecting elements are laterally spaced with respect to a direction of travel of a fundamental signal for the at least one active power device.

2. The semiconductor die of claim 1, wherein at least one of the conductive sub-structure and the plurality of interconnecting elements provides a resistive path for lateral currents flowing within the terminal structure.

3. The semiconductor die of claim 1, wherein the conductive sub-structure and the first and second interconnecting elements provide an impedance at each of a first and a second end of the fundamental signal layer that matches the lateral impedance of the fundamental signal layer.

4. The semiconductor die of claim 1, wherein the interconnecting elements capacitively couple the fundamental signal layer to the conductive sub-structure.

5. An integrated circuit device comprising at least one semiconductor die, wherein the at least one semiconductor die comprising at least one active power device and at least one terminal structure and the at least one terminal structure comprises:
  a fundamental signal layer arranged to be electrically coupled between the at least one active power device and an external contact of an integrated circuit package;
  a conductive sub-structure extending in parallel with the fundamental signal layer, and located such that, when mounted within the integrated circuit device, the conductive sub-structure lies between the fundamental signal layer and a reference voltage plane, wherein the conductive sub-structure comprises a plurality of metallic strips extending in parallel with the fundamental signal layer, and located such that when mounted within the integrated circuit device the metallic strips lie in a plane between the fundamental signal layer and a reference voltage plane; and
  a plurality of interconnecting elements extending between the fundamental signal layer and the conductive sub-structure, and electrically coupling the fundamental signal layer to the conductive sub-structure, wherein the plurality of interconnecting elements comprise
  a first interconnecting element extending between a first lateral end region of the fundamental signal layer and the conductive sub-structure; and
  a second interconnecting element extending between a second lateral end region of the fundamental signal layer and the conductive sub-structure such that the first and second interconnecting elements are laterally spaced with respect to a direction of travel of a fundamental signal for the at least one active power device.

6. The integrated circuit device of claim 5, wherein at least one of the conductive sub-structure and the plurality of interconnecting elements provides a resistive path for lateral currents flowing within the terminal structure.

7. The integrated circuit device of claim 5, wherein the conductive sub-structure and the first and second interconnecting elements provide an impedance at each of a first and a second end of the fundamental signal layer that matches the lateral impedance of the fundamental signal layer.

8. The integrated circuit device of claim 5, wherein the conductive sub-structure comprises at least one metallic layer located closer to the reference voltage plane than the fundamental signal layer, when mounted within the integrated circuit device.

* * * * *